(12) United States Patent
Su et al.

(10) Patent No.: US 12,419,077 B2
(45) Date of Patent: Sep. 16, 2025

(54) METHOD FOR FORMING DUAL SILICIDE IN MANUFACTURING PROCESS OF SEMICONDUCTOR STRUCTURE

(71) Applicant: Taiwan Semiconductor Manufacturing Company, Ltd., Hsinchu (TW)

(72) Inventors: Ying-Chi Su, Hsinchu (TW); Li-Wei Chu, Hsinchu (TW); Hung-Hsu Chen, Hsinchu (TW); Chih-Wei Chang, Hsinchu (TW); Ming-Hsing Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 610 days.

(21) Appl. No.: 17/847,787

(22) Filed: Jun. 23, 2022

(65) Prior Publication Data

US 2023/0420565 A1 Dec. 28, 2023

(51) Int. Cl.
  *H10D 30/62* (2025.01)
  *H10D 30/01* (2025.01)
  *H10D 62/83* (2025.01)
  *H10D 84/01* (2025.01)
  *H10D 84/03* (2025.01)

(52) U.S. Cl.
  CPC ....... *H10D 30/6211* (2025.01); *H10D 30/024* (2025.01); *H10D 62/83* (2025.01); *H10D 84/0158* (2025.01); *H10D 84/038* (2025.01)

(58) Field of Classification Search
  CPC ............. H10D 30/6211; H10D 30/024; H10D 84/0158; H10D 84/038; H10D 62/83
  See application file for complete search history.

(56) References Cited

U.S. PATENT DOCUMENTS

| | | | |
|---|---|---|---|
| 2015/0008489 A1* | 1/2015 | Ching | H01L 29/66795 257/288 |
| 2017/0229560 A1* | 8/2017 | Yu | H01L 29/66818 |
| 2018/0350586 A1* | 12/2018 | Cai | H10H 20/062 |
| 2019/0295844 A1* | 9/2019 | Lee | H10D 86/215 |
| 2020/0126979 A1* | 4/2020 | Ching | H10D 64/017 |
| 2020/0381545 A1* | 12/2020 | Chiang | H01L 29/42392 |
| 2021/0083054 A1* | 3/2021 | Liaw | H01L 27/088 |
| 2021/0083055 A1* | 3/2021 | Liaw | H10D 62/292 |
| 2021/0098450 A1* | 4/2021 | Huang | H02K 15/027 |
| 2021/0098604 A1* | 4/2021 | Lin | H10D 62/021 |
| 2021/0118994 A1* | 4/2021 | Tsai | H10D 84/038 |
| 2021/0126113 A1* | 4/2021 | Lin | H10D 30/6735 |
| 2021/0257462 A1* | 8/2021 | Lu | H01L 21/823481 |
| 2021/0375858 A1* | 12/2021 | Chiang | H10D 84/038 |

(Continued)

*Primary Examiner* — Jeff W Natalini
*Assistant Examiner* — Andrew John Zabel
(74) *Attorney, Agent, or Firm* — Birch, Stewart, Kolasch & Birch, LLP

(57) ABSTRACT

A method for manufacturing a semiconductor structure includes: forming a patterned structure which includes a first semiconductor portion and a second semiconductor portion, the first and second semiconductor portions having different materials; and performing an oxide formation process to oxidize the first and second semiconductor portions such that a first oxidation layer formed on the first semiconductor portion has a thickness less than that of a second oxidation layer formed on the second semiconductor portion.

20 Claims, 11 Drawing Sheets

(56) References Cited

U.S. PATENT DOCUMENTS

| | | | |
|---|---|---|---|
| 2022/0013653 A1* | 1/2022 | Jhan | H01L 29/6681 |
| 2022/0029023 A1* | 1/2022 | Chen | H10D 84/854 |
| 2022/0037487 A1* | 2/2022 | Liao | H10D 84/0144 |
| 2022/0093593 A1* | 3/2022 | Yang | H10D 84/038 |
| 2022/0115387 A1* | 4/2022 | Yang | H01L 29/0673 |
| 2023/0054633 A1* | 2/2023 | Loh | H10D 84/0193 |
| 2023/0092313 A1* | 3/2023 | Jin | H10B 10/12 257/401 |

* cited by examiner

METHOD FOR FORMING DUAL SILICIDE IN MANUFACTURING PROCESS OF SEMICONDUCTOR STRUCTURE

BACKGROUND

In order to produce high quality semiconductor devices with promising device performance in a more cost-effective manner, the industry has put much effort in refinement of various steps in the manufacturing processes of semiconductor devices. In the manufacturing processes, dual silicide is known to effectively reduce contact resistance among components in semiconductor devices, and thus various means to achieve dual silicide formation have become an important research focus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
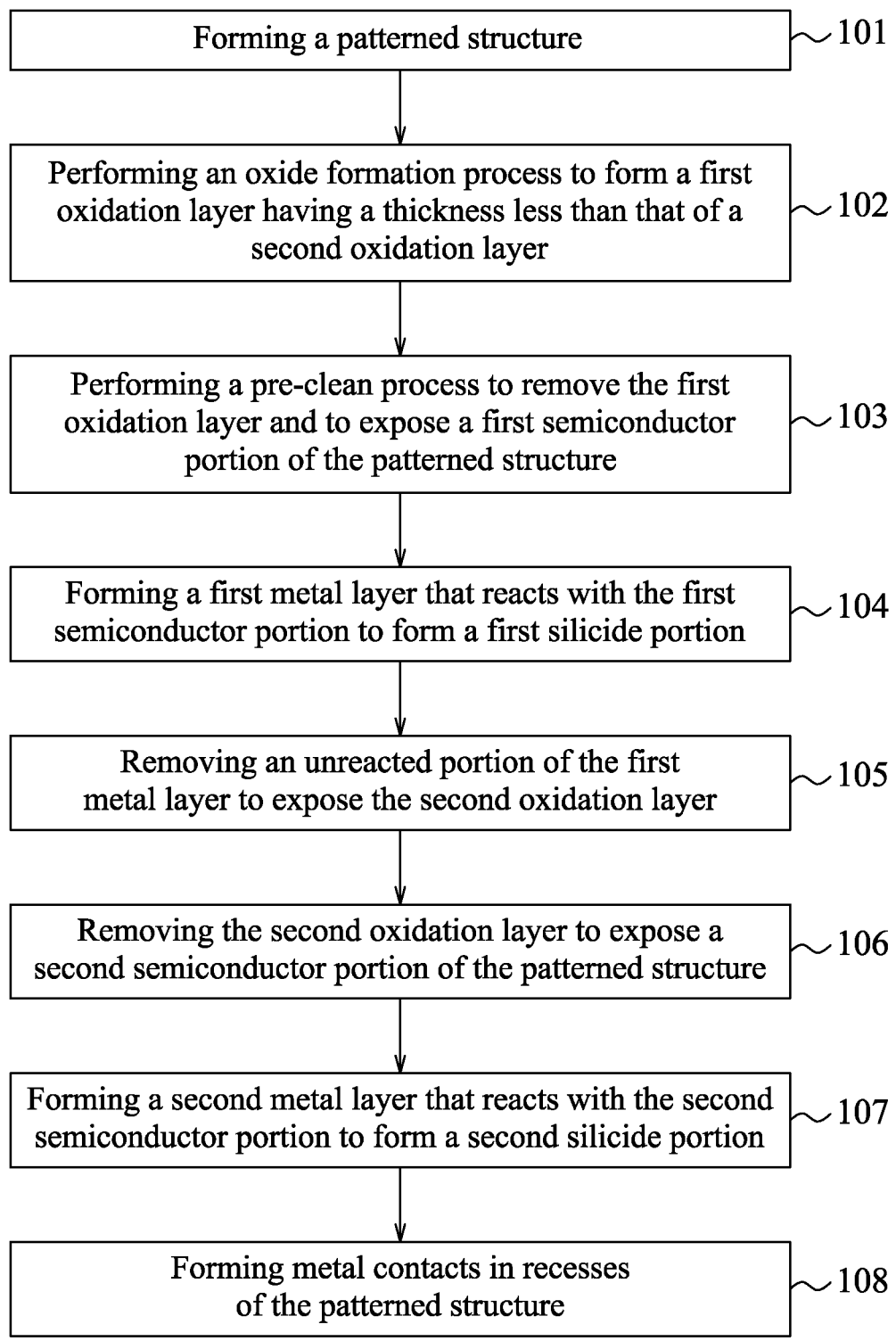
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a method for manufacturing a semiconductor structure, in which source/drain portions of the semiconductor structure are subjected to a dual silicide formation. For instance, in some embodiments, titanium silicide is formed on an n-type source/drain portion and nickel silicide is formed on the p-type semiconductor portion, such that a respective one of schottky barrier height between metal plugs and each of the n-type and p-type source/drain portions may be effectively reduced, so as to reduce a contact resistance therebetween. In the present disclosure, during the dual silicide formation, number of times of a patterning process required may be reduced by adopting a selective oxidation process of source/drains portions having different materials. The semiconductor structure manufactured according to the method of the present disclosure may be applied in, for example, but not limited to, a metal-oxide-semiconductor field effect transistor (MOSFET), such as a planar MOSFET, a fin-type FET (FinFET), a gate-all-around (GAA) nanosheet FET, or other suitable semiconductor devices.

FIG. 1 is a flow diagram illustrating the method for manufacturing the semiconductor structure in accordance with some embodiments. FIGS. 2 to 9 illustrate schematic views of the intermediate stages of the method in accordance with some embodiments. Some portions in FIGS. 2 to 9 are omitted for the sake of brevity. Additional steps can be provided before, after or during the method, and some of the steps described herein may be replaced by other steps or be eliminated.

Figure 2:
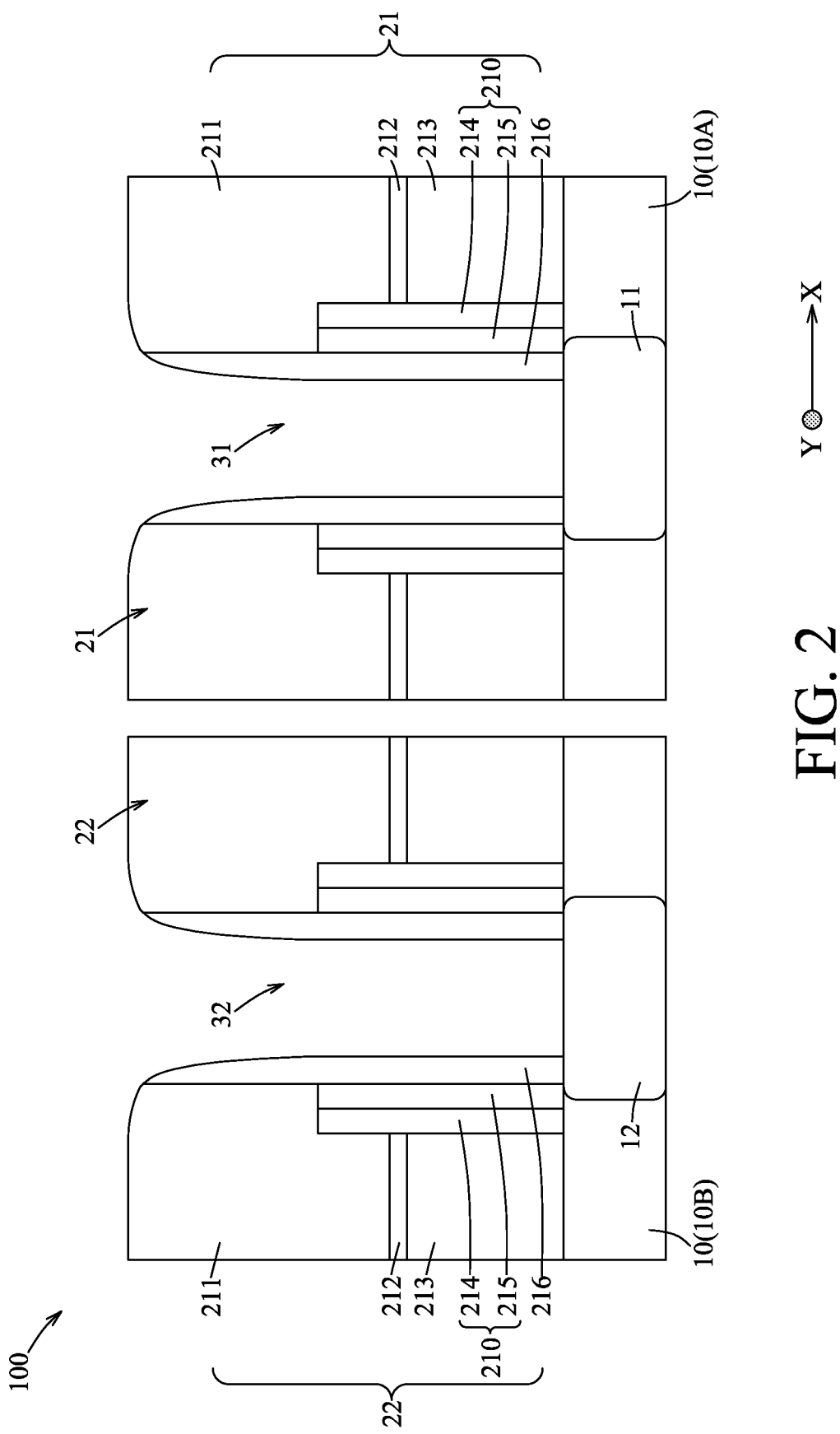
FIGS. 2 to 9 are schematic views illustrating intermediate stages of the method for manufacturing the semiconductor structure in accordance with some embodiments.

Referring to FIG. 1 and the example illustrated in FIG. 2, the method begins at step 101, where a patterned structure 100 is formed. FIG. 2 is an enlarged schematic view of the patterned structure 100 in accordance with some embodiments in which some of the elements within the patterned structure 100 are not shown. The patterned structure 100 includes a substrate (not shown), at least one semiconductor fin 10 elongated in an X direction on the substrate, at least two isolation portions (not shown) disposed on the substrate at two opposite sides of the semiconductor fin 10, a first semiconductor portion 11 formed in a first portion 10A of the semiconductor fin 10, a second semiconductor portion 12 formed in a second portion 10B of the semiconductor fin 10, at least two first gate features 21 which are each elongated in a Y direction transverse to the X direction over the first portion 10A of the semiconductor fin 10, and which are spaced apart from each other to expose the first semiconductor portion 11, and a plurality of second gate features 22 which are each elongated in the Y direction over the second portion 10B of the semiconductor fin 10, and which are spaced apart from each other to expose the second semiconductor portion 12.

In FIG. 2, the first and second semiconductor portions 11, 12, first and second recesses 31, 32, the gate features 21, 22, and the semiconductor fin 10 are shown, while other elements of the patterned structure 100 such as the substrate, the isolation portions, and so on are not shown for the sake of brevity.

The substrate may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the substrate may be doped with p-type impurities or n-type impurities, or undoped. In addition, the substrate may be a bulk silicon substrate, a silicon-on-insulator (SOI) substrate, or a germanium-on-insulator (GOI) substrate. Other suitable materials for the substrate are within the contemplated scope of the present disclosure.

The semiconductor fin 10 may be made from a material the same or different from that of the substrate. Since suitable materials for the semiconductor fin 10 are similar to those for the substrate, the details thereof are omitted for the sake of brevity. In some embodiments, the patterned structure 100 may include a plurality of semiconductor fins 10 which are spaced apart from each other in the Y direction. The number of the semiconductor fins can be varied according to the layout design of the semiconductor structure. For clarity purpose, one semiconductor fin 10 will be described with reference to FIGS. 2 to 9.

The isolation portions are formed on the substrate to isolate the semiconductor fin 10 from another semiconductor fin. The isolation portions may each be a portion of a shallow trench isolation (STI), a deep trench isolation (DTI), or other suitable structures, and may be made of an oxide material (for example, silicon oxide), a nitride material (for example, silicon nitride), or a combination thereof. Other suitable materials for the isolation portions are within the contemplated scope of the present disclosure.

The first semiconductor portion 11 and the second semiconductor portion 12 are respectively formed in the first and second portions 10A and 10B of the semiconductor fin 10 and have different materials. In some embodiments, each of the first and second semiconductor portions 11, 12 may include a plurality of epitaxial layers. Each of the semiconductor portions 11, 12 may individually include silicon, silicon germanium, silicon carbide, germanium, III-V compound semiconductors, or combinations thereof. Each of the semiconductor portions 11, 12 may be independently doped with an n-type impurity (e.g., phosphorus, nitrogen, arsenic, antimony, bismuth), or may be doped with a p-type impurity (e.g., boron), or may be intrinsic. Other suitable materials and/or dopants for the first and second semiconductor portions 11, 12 are within the contemplated scope of the present disclosure. The first semiconductor portion 11 may be a p-type semiconductor portion, and the second semiconductor portion 12 may be an n-type semiconductor portion, or vice versa.

In some embodiments, the first semiconductor portion 11 is a p-type semiconductor portion which is made of or includes a silicon germanium-based material, and can serve as a p-type source/drain region. The amount of germanium present in the silicon germanium-based material ranges from about 35 wt % to about 65 wt % based on a total weight of the silicon germanium-based material. It is noted that a p-type semiconductor portion that is germanium-rich is beneficial to enhance performance of the semiconductor structure produced therefrom. The first semiconductor portion 11 may be doped with boron at a dopant concentration ranging from about $1\times10^{21}$ atom/cm$^3$ to about $6\times10^{21}$ atom/cm$^3$. In some embodiments, the second semiconductor portion 12 is an n-type semiconductor portion which is made of or includes a silicon-based material. In some embodiments, an amount of germanium present in the silicon germanium-based material of the first semiconductor portion 11 is higher than an amount of germanium present in the silicon-based material of the second semiconductor portion 12. The second semiconductor portion 12 can serve as an n-type source/drain region. The second semiconductor portion 12 is doped with phosphorus at a dopant concentration ranging from about $5\times10^{20}$ atom/cm$^3$ to about $4\times10^{21}$ atom/cm$^3$. Please note that source/drain region(s) may refer to a source or a drain, individually or collectively dependent upon the context.

The two first gate features 21 are spaced apart from each other and are formed on the semiconductor fin 10 at two opposite sides of the first semiconductor portion 11 to define a first recess 31 that exposes a portion of the first semiconductor portion 11. The two second gate features 22 are spaced apart from each other and are formed on the semiconductor fin 10 at two opposite sides of the second semiconductor portion 12 to define a second recess 32 that exposes a portion of the second semiconductor portion 12. Each of the first and second gate features 21, 22 includes an isolation element 211, a capping layer 212, a gate portion 213, two gate spacer elements 210 (one of which is shown in FIG. 2), and a silicon nitride redeposition (SNR) layer 216.

The gate portion 213 may include a gate electrode and a gate dielectric (not shown). The gate dielectric is disposed to separate the gate electrode from the semiconductor fin 10, and may include silicon oxide, silicon nitride, silicon oxynitride, high dielectric constant (k) materials, other suitable materials, or combinations thereof, and the gate electrode may include aluminum, tungsten, copper, other suitable materials, or combinations thereof. Other suitable materials for forming the gate electrode and/or the gate dielectric are within the contemplated scope of the present disclosure.

The capping layer 212 provides a seam less surface over the gate electrode of the gate portion 213, and may include, for example, but not limited to, tungsten. Other suitable materials for the capping layer 212 are within the contemplated scope of the present disclosure.

The isolation element 211 may include a low-k dielectric material for example, but not limited to, silicon oxides, silicon nitride, silicon carbide, boron nitride, boron carbide, or the like, or combinations thereof. In some embodiments, the isolation element 211 includes silicon nitride. Other suitable materials for the isolation element 211 are within the contemplated scope of the present disclosure. In some embodiments, the isolation element 211 may serve as a self-aligned contact (SAC).

In some embodiments, each of the gate spacer elements 210 may include a first gate spacer 214, and a second gate spacer 215. Each of the first and second gate spacers 214, 215 may independently include a silicon carbon-containing dielectric material, a silicon oxide-containing material, silicon nitride, or combinations thereof. Other suitable materials for the first and second gate spacers 214, 215 are within the contemplated scope of the present disclosure.

The SNR layer 216 is made of silicon nitride, and is configured to isolate the gate portion 213 from metal contacts 80 (see also FIG. 9) formed in step 108 subsequently.

In some embodiments, the patterned structure 100 may be formed by sub-steps of: (i) patterning a substrate (not shown) to form the semiconductor fin 10 elongated in the X direction on a remaining portion of the substrate (i.e., the substrate as mentioned above); (ii) forming an isolation layer over the substrate and the semiconductor fin 10 followed by a planarization process, for example, but not limited to, chemical mechanical polishing (CMP), to form the isolation portions; (iii) recessing the isolation portions to form the above-mentioned isolations portions and to expose an upper portion of the semiconductor fin 10; (iv) forming a plurality of dummy portions (not shown, each being elongated in the Y direction) over the semiconductor fin 10 such that the semiconductor fin 10 has two fin portions exposed from and located at two opposite sides of each of the dummy portions; (v) forming two gate spacer elements 210 (each including the first and second gate spacers 214, 215) at two opposite sides of each of the dummy portions; (vi) recessing the fin portions exposed from the dummy portions to form the recessed fin portions; (vii) forming the first semiconductor portion 11 on one of the recessed fin portions and the second semiconductor portion 12 on the other one of the recessed fin portions; (viii) forming an interlayer dielectric (ILD) layer (not shown), followed by a planarization process (e.g., CMP), to expose lower parts of the dummy portions; (ix) replacing the lower parts of the dummy portions with active gates (not shown); (x) etching back the active gates to obtain a plurality of the gate portion 213; (xi) forming a plurality of the capping layers 212 respectively on the gate portions 213 and forming a plurality of the isolation elements 211 respectively on the capping layers 212; (xii) performing a patterning process to expose the first and second semiconductor portions 11, 12; and (xiii) forming a SNR material layer for forming the SNR layers 216 of the first and second gate features 21, 22 over the structure obtained in sub-step (xii) and then removing portions of the SNR material layer on the isolation elements 211 and the first and second semiconductor portions 11, 12. After sub-step (xiii), the patterned structure 100 as shown in FIG. 2 is obtained. Other suitable processes for forming the patterned structure 100 are within the contemplated scope of the present disclosure.

Each of the lower parts of the dummy portions may include a dummy gate and a dummy dielectric disposed beneath the dummy gate. Each of the dummy portions may further include an upper part which is removed by the planarization process in sub-step (viii), and which includes a hard mask layer and a polish-stop layer disposed beneath the hard mask layer. The dummy gate may include polycrystalline silicon, single crystalline silicon, amorphous silicon, or combinations thereof; the dummy dielectric may include silicon oxide, silicon nitride, silicon oxynitride, high dielectric constant (k) materials, or combinations thereof; the polish-stop layer may include silicon nitride, silicon oxide, other nitrides, other oxides, other suitable materials, or combinations thereof; and the hard mask layer may include silicon nitride, silicon oxide, silicon oxynitride, other suitable materials, or combinations thereof. Other suitable materials for the dummy portions are within the contemplated scope of the present disclosure.

In sub-step (viii), the ILD layer may include a dielectric material such as, but not limited to, silicon oxide, silicon nitride, silicon oxynitride, or combinations thereof. Other suitable materials for forming the ILD layer are within the contemplated scope of the present disclosure.

In sub-step (ix), the lower parts of the dummy portions may be removed by dry etching, wet etching, other suitable processes, or combinations thereof, and the active gates may be formed by depositing a gate electrode layer (to form the gate electrode) and a gate dielectric layer (to form the gate dielectric) using for example but not limited to, chemical vapor deposition (CVD), high density plasma CVD (HDPCVD), sub-atmospheric CVD (SACVD), molecular layer deposition (MLD), or physical vapor deposition (PVD); and performing a planarization process, for example, but not limited to, CMP, to remove excesses of the gate electrode layer and the gate dielectric layer and to expose the ILD layer.

In sub-step (x), the etching back of the active gates may be performed by dry etching, wet etching, other suitable processes, or combinations thereof.

In sub-step (xi), the capping layers 212 are selectively grown on the gate portions 213, and a material for forming the isolation elements 211 is deposited over the capping layers 212 and the planarized ILD layer, followed by a planarization process (e.g. CMP) to expose the planarized ILD layer, thereby forming the isolation element 211. Other suitable processes for forming the capping layers 212 and the isolation elements 211 are within the contemplated scope of the present disclosure.

In sub-step (xii), the patterning process may be performed by forming a patterned mask layer over the structure obtained in sub-step (xi), the patterned mask layer being a patterned photoresist or a patterned hard mask and having openings in positions respectively corresponding to the first and second semiconductor portions 11, 12; etching the planarized ILD layer through the openings of the patterned mask layer using dry etching, wet etching, other suitable processes, or combinations thereof, to expose the first and second semiconductor portions 11, 12; and removing the patterned mask layer. Other suitable processes for performing the patterning process are within the contemplated scope of the present disclosure.

In sub-step (xiii), the SNR material layer is formed using, for example, but not limited to, CVD; the portions of the SNR material layer are removed using, for example, but not limited to, antistrophic etching, thereby forming the SNR layers 216. Other suitable processes for forming the SNR layers 216 are within the contemplated scope of the present disclosure.

Figure 3:
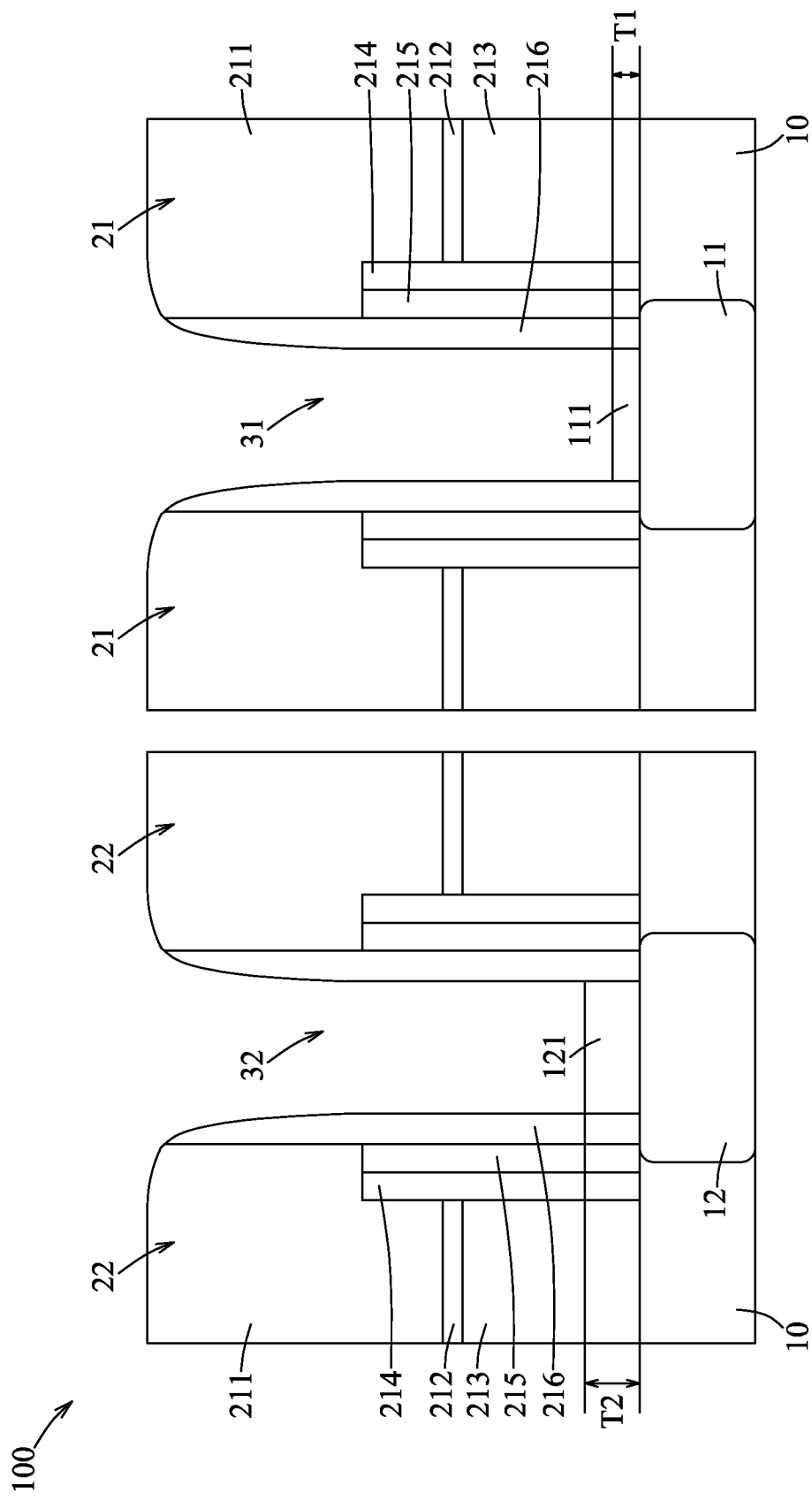

Referring to FIG. 1 and the example illustrated in FIG. 3, the method proceeds to step 102, where an oxide formation process is performed to oxidize the first and second semiconductor portions 11, 12, such that a first oxidation layer 111 is formed on the first semiconductor portion 11, and a second oxidation layer 121 is formed on the second semiconductor portion 12. The first oxidation layer 111 has a thickness (T1) less than a thickness (T2) of the second oxidation layer 121. In some embodiments, the thickness (T1) ranges from about 1 nm to about 4 nm, and the thickness (T2) ranges from about 4 nm to about 8 nm. In some other embodiments, the thickness (T1) ranges from about 1 nm to about 3 nm. Such thickness difference facilitates step 103 to be performed subsequently, and will be discussed later.

During the oxide formation process, an oxidizing agent is introduced at a flow rate ranging from about 50 sccm to about 300 sccm to oxidize the first and second semiconductor portions 11, 12. The oxidizing agent may be introduced using, for example but not limited to, a remoted plasma oxidation process or a direct plasma oxidation process. The oxidation process may be conducted at a temperature ranging from about 100° C. to about 400° C. Depending on the type of tool used, the oxidation process may be conducted at a pressure ranging from about 300 mTorr to about 1 Torr for a time period ranging from about 1 min to about 15 min. Examples of the oxidizing agent are oxygen, water, or a combination thereof. Other suitable oxidizing agents are within the contemplated scope of the present disclosure. In some embodiments, oxygen is used as the oxidizing agent. For the first semiconductor portion 11, a portion of the silicon and germanium (of the first semiconductor portion 11) are oxidized into silicon oxide and germanium oxide that form the first oxidation layer 111. For the second semiconductor portion 12, a portion of the silicon (of the first semiconductor portion 12) is oxidized into silicon oxide that form the second oxidation layer 121.

During step 102, in addition to the oxidizing agent, a thickness controlling agent is also introduced such that the thickness (T1) of the first oxidation layer 111 is less than the thickness (T2) of the second oxidation layer (121). In some embodiments, the thickness controlling agent is a reducing agent. Examples of the reducing agent are hydrogen ($H_2$), ammonia ($NH_3$), hydrofluoric acid (HF), or combinations thereof. The reducing agent may be applied using a plasma treatment (e.g., $H_2$ plasma, $NH_3$ plasma, HF plasma) or an annealing treatment (e.g., $H_2$ annealing). The plasma may be performed using a remote plasma treatment or a direct plasma treatment conducted at a power ranging from about 300 W to about 900 W at a temperature ranging from about 10° C. to about 35° C., such as room temperature, and under a pressure ranging from about 0.8 mTorr to about 800 mTorr. In addition to the reducing agent, an inert gas (such as argon or nitrogen) may be added during the plasma treatment. Other suitable reducing agents and processes for applying the reducing agents are within the contemplated scope of the present disclosure. In some embodiments, when the oxidizing agent and the reducing agent are introduced simultaneously, the oxidizing agent occupies a majority of a total amount of the oxidizing agent and the reducing agent introduced. In some other embodiments, the oxidizing agent is first introduced, followed by introduction of the reducing agent.

In some other embodiments, the thickness controlling agent is an etchant which has a higher etching rate for the second oxidation layer 121 than the first oxidation layer 111. The etchant may be applied using hot deionized water and a dilute hydrochloric acid solution for a time period ranging from about 10 seconds to about 120 seconds. The deionized water may be supplied at a temperature ranging from about 70° C. to about 90° C. Hydrochloric acid may be present in an amount ranging from about 5 wt % to about 30 wt % based on 100 wt % of the dilute hydrochloric acid solution. The dilute hydrochloric acid solution may be supplied at a temperature ranging from about 40° C. to about 60° C. In other embodiments, both the reducing agent and the etchant may be used to serve as the thickness controlling agent. Other suitable etchants are within the contemplated scope of the present disclosure.

In step 102, the reducing agent may reduce germanium oxide to germanium, and has substantially no effect on silicon oxide, and/or the etchant may selectively remove germanium oxide. That is, upon introduction of the reducing agent and/or the etchant, the second oxidation layer 121 which includes mainly silicon oxides remains unaffected, while for the first oxidation layer 111, at least a portion of germanium oxides formed during the oxide formation process is reduced to germanium and/or be removed. As a result, the thickness (T1) of the first oxidation layer 111 is less than the thickness (T2) of the second oxidation layer 121. Moreover, it is noted that since the germanium oxide in the first oxidation layer 111 is at least partially reduced/removed to allow the first oxidation layer 111 to have a less compact structure, the first oxidation layer 111 may be etched at an etching rate higher than that of the second oxidation layer 121, thereby facilitating step 103 to be performed subsequently.

Other suitable processes and/or adjustments of parameters for forming the first and second oxidation layers 111, 121 are within the contemplated scope of the present disclosure.

Figure 4:
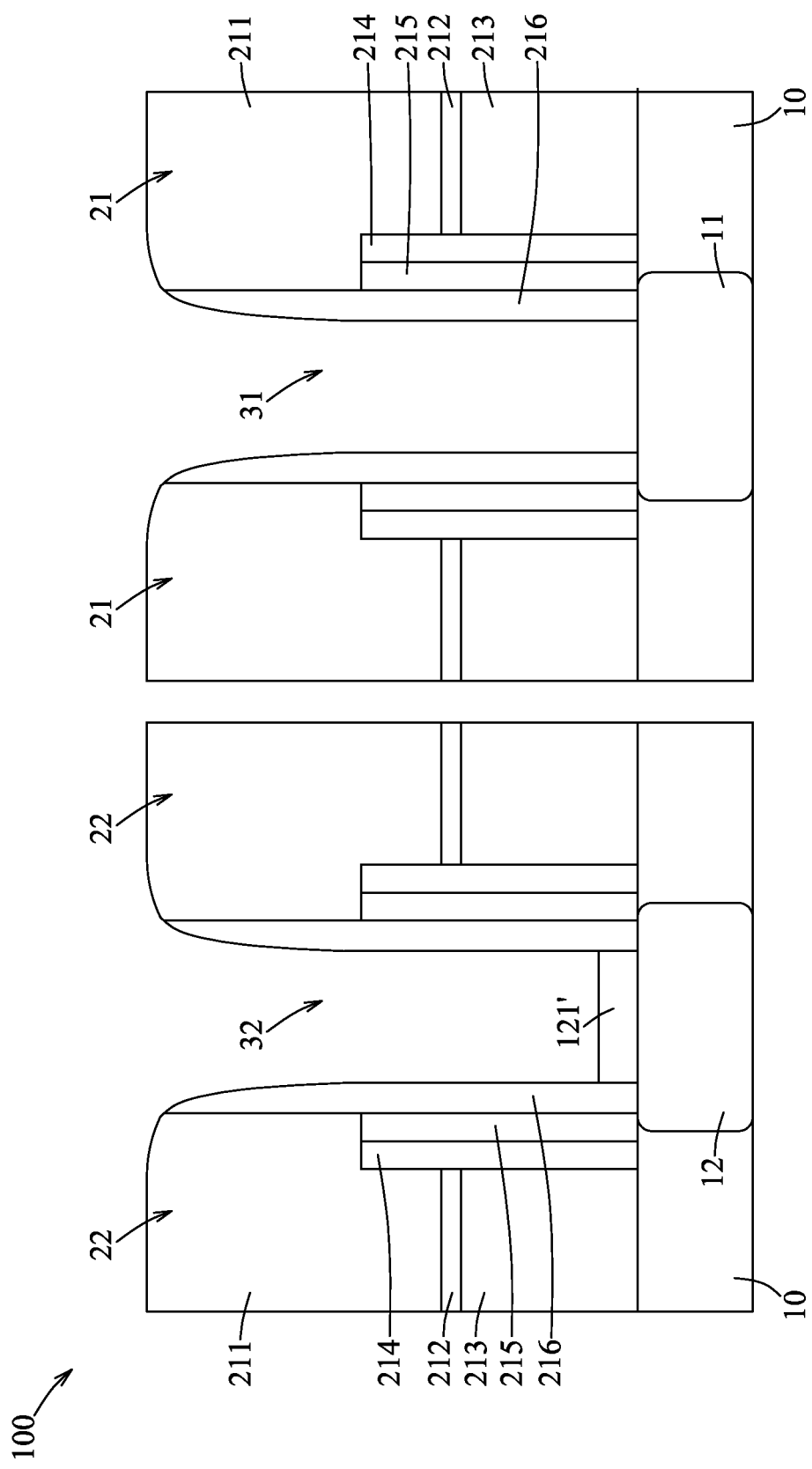

Referring to FIG. 1 and the example illustrated in FIG. 4, the method proceeds to step 103, where a pre-clean process is performed to remove the first oxidation layer 111 and a portion of the second oxidation layer 121, leaving a remaining portion of the second oxidation layer, denoted by the numeral 121' on the second semiconductor portion 12.

In some embodiments, the pre-clean process may be performed using, for example but not limited to, a remote plasma treatment or a direct plasma treatment, which is conducted by introducing an etching gas of a flow rate ranging from about 3 sccm to about 20 sccm at a power ranging from about 30 W to about 500 W at a temperature ranging from about 10° C. to about 75° C., and under a pressure ranging from about 30 mTorr to about 80 mTorr for a time period ranging from about 0.3 seconds to about 70 seconds. The etching gas may include, for example, but are not limited to, ammonia ($NH_3$), hydrogen fluoride (HF), nitrogen trifluoride ($NF_3$), hydrogen chloride (HCl) or combinations thereof, is used in the presence of a carrier gas (such as argon (Ar), helium (He) or nitrogen ($N_2$)) to remove first oxidation layer 111 and a portion of the second oxidation layer 121. Other suitable etching gases are within the contemplated scope of the present disclosure.

Other suitable processes and/or reagents and/or adjustments of parameters for removing the first oxidation layer 111 and a portion of the second oxidation layer 121 are within the contemplated scope of the present disclosure.

Figure 5:
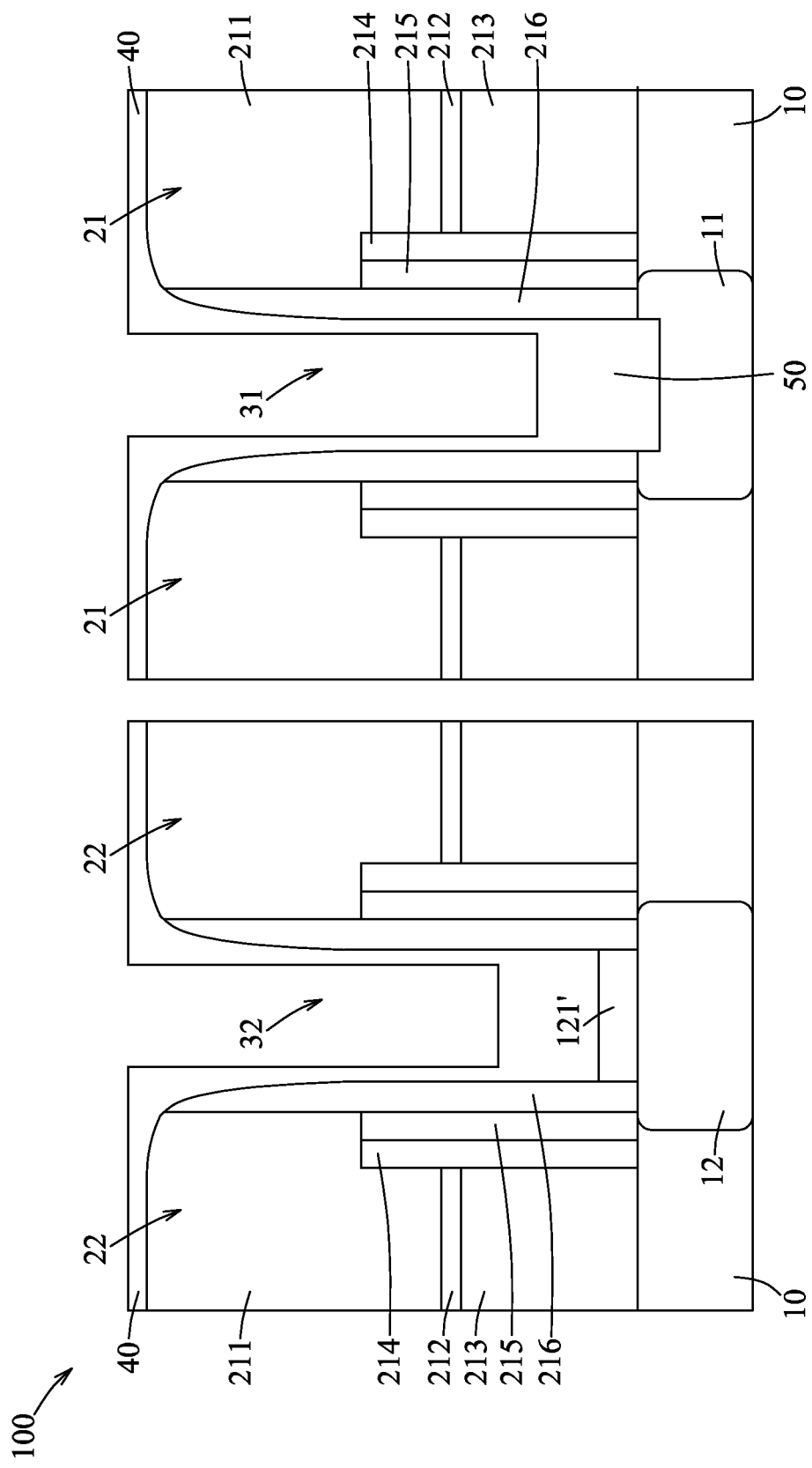

Referring to FIG. 1 and the example illustrated in FIG. 5, the method proceeds to step 104, where a first metal layer 40 is formed on the pre-cleaned structure shown in FIG. 4. A portion of the first metal layer 40 deposited on the first semiconductor portion 11 in the first recess 31 is permitted to react with the silicon germanium of the first semiconductor portion 11 to form a first silicide portion 50, leaving a remaining unreacted portion of the first metal layer 40.

In some embodiments, step 104 includes the sub-steps of: (i) depositing the first metal layer 40 on the pre-cleaned structure of FIG. 4; and (ii) performing a thermal treatment (for example, but not limited to, an annealing process) to permit formation of the first silicide portion 50.

In sub-step (i), in some embodiments, the first metal layer 40 is deposited using, for example but not limited to, a PVD process, such as sputtering. In some embodiments, the first metal layer 40 has a thickness ranging from about 1 nm to about 20 nm, depending on different application needs.

In some embodiments, a first metallic target including, for example but not limited to, nickel and platinum, is used in the PVD process to deposit the first metal layer 40, and platinum is present in an amount ranging from 0 wt % to 10 wt % based on 100 wt % of the first metallic target. That is, in some cases, the first metallic target may be a pure nickel, or an alloy of nickel and platinum. In some embodiments, when the first metallic target include nickel and platinum, the first silicide portion 50 formed thereby includes nickel platinum silicon germanium. Other suitable first metallic targets are within the contemplated scope of the present disclosure.

In some embodiments, the formation of the first metal layer 40 is conducted under a power supply ranging from about 200 W to about 1000 W at a temperature ranging from about −20° C. to about 35° C. for a time period ranging from about 50 seconds to about 700 seconds. Such low temperature condition may effectively avoid formation of nickel silicide on the second semiconductor portion 12 during the deposition process.

In sub-step (ii), the annealing process is performed without the presence of oxygen, and is performed at an annealing temperature ranging from about 200° C. to about 450° C. For the first semiconductor portion 11, the annealing process permits nickel and platinum in the first metal layer 40 diffusing and reacting with the silicon and germanium so as to form the first silicide portion 50 including nickel platinum silicon germanium (NiPtSiGe). For the second semiconductor portion 12, the remaining portion of the second oxidation layer 121' obtained in step 103 serves as a barrier layer prevent metal(s) in the first metal layer 40 from diffusing through the remaining portion of the second oxidation layer 121' and reacting with the second semiconductor portion 12, and thus there is no silicide formation on the second semiconductor portion 12. By controlling the temperature for annealing, the thickness of first silicide portion 50 can be controlled, for example, the higher the annealing temperature, the thicker the first silicide portion 50 obtained.

Other suitable processes and/or adjustments of parameters for forming the first metal layer 40 and/or the first silicide portion 50 are within the contemplated scope of the present disclosure.

Figure 6:
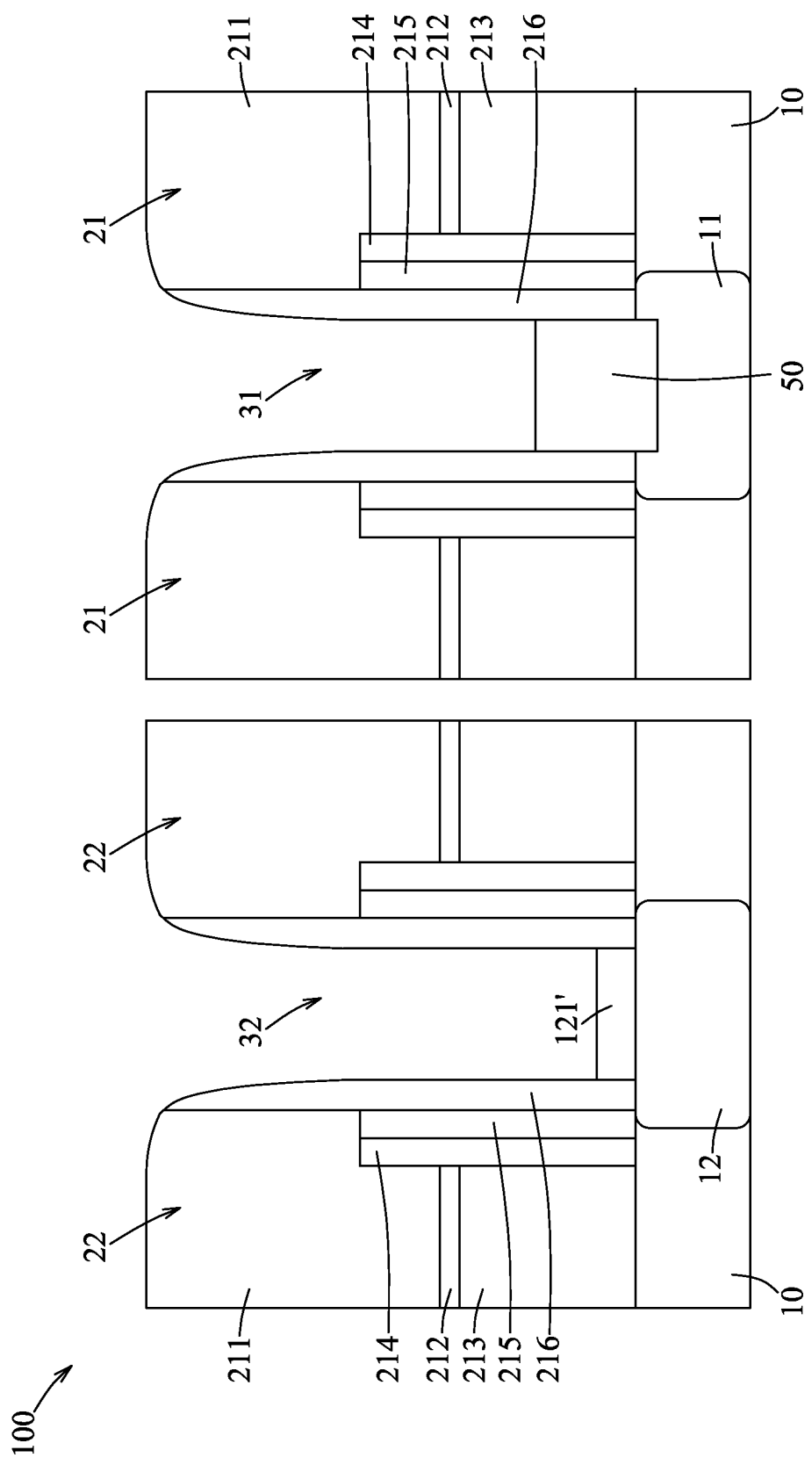

Referring to FIG. 1 and the example illustrated in FIG. 6, the method proceeds to step 105, where the unreacted portion of the first metal layer 40 shown in FIG. 5 is removed to expose the remaining portion of the second oxidation layer 121'. The unreacted portion of the first metal layer 40 at least includes a portion of the first metal layer 40 deposited on the remaining portion of the second oxidation layer 121'.

In some embodiments, the removal of the unreacted portion of the first metal layer 40 is a wet stripping process using an oxidizing agent. Examples of the oxidizing agent are sulphuric acid, hydrochloric acid, hydrogen peroxide, ammonium hydroxide, or combinations thereof. Other suitable oxidizing agents for removing the unreacted portion of the first metal layer 40 are within the contemplated scope of the present disclosure. In some embodiments, the stripping process is conducted at a temperature ranging from about 10° C. to about 180° C. for a time period ranging from about 30 seconds to about 210 seconds according to a desired removal rate of the first metal layer 40. After step 105, the remaining second oxidation layer 121' is exposed, and the first silicide portion 50 remains unaffected by the oxidizing agent. Other suitable processes and/or adjustments of parameters for removing the unreacted portion of the first metal layer 40 are within the contemplated scope of the present disclosure.

Figure 7:
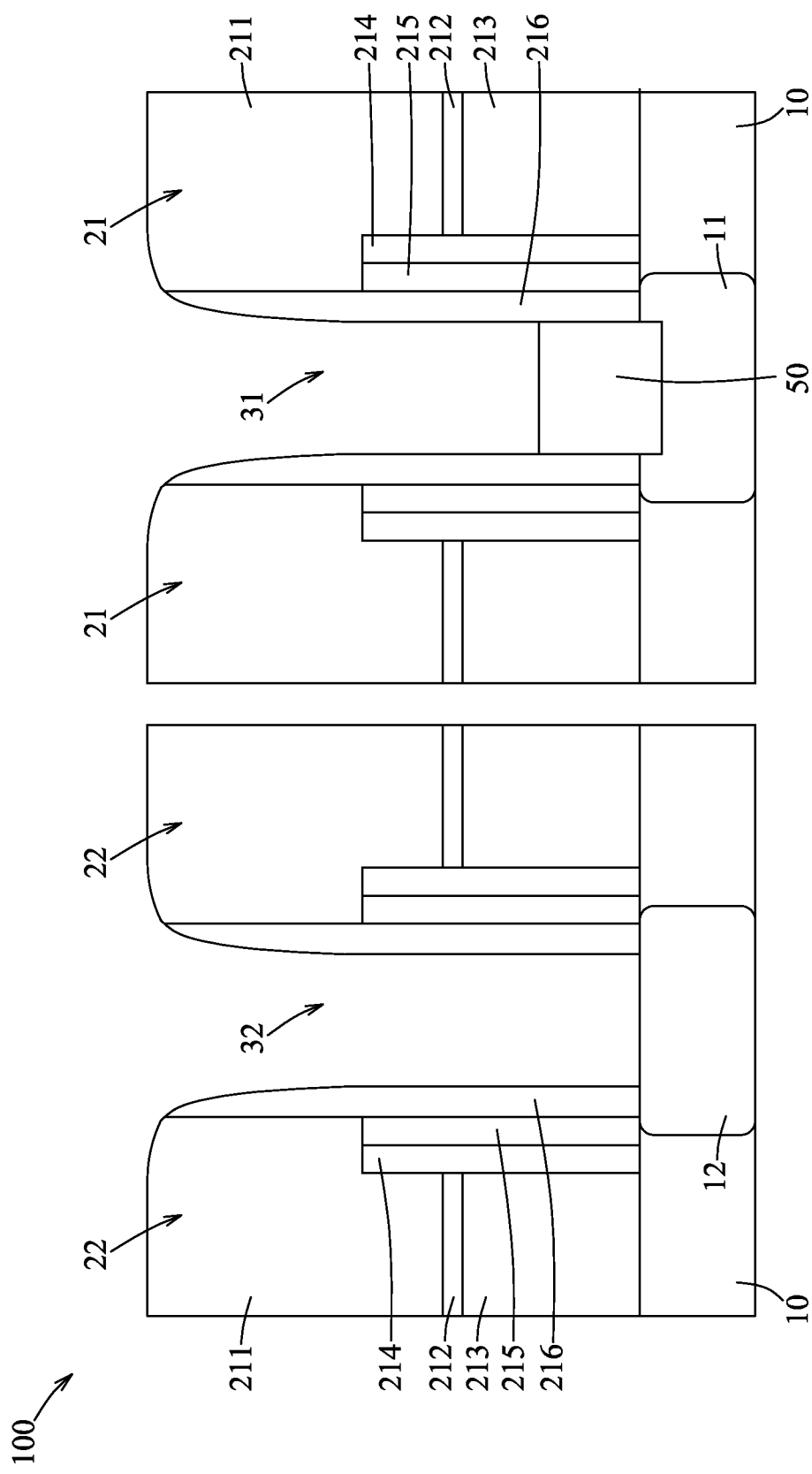

Referring to FIG. 1 and the example illustrated in FIG. 7, the method proceeds to step 106, where the remaining portion of the second oxidation layer 121' shown in FIG. 6 is removed, after removal of the unreacted portion of the first metal layer 40, to expose the second semiconductor portion 12.

In some embodiments, step 106 may be performed using an etchant which has a higher etching selectivity to the remaining second oxidation layer 121' than other elements shown in FIG. 6, or the plasma treatment used in step 103. Other suitable processes and/or adjustments of parameters for removing the remaining portion of the second oxidation layer 121' are within the contemplated scope of the present disclosure.

Figure 8:
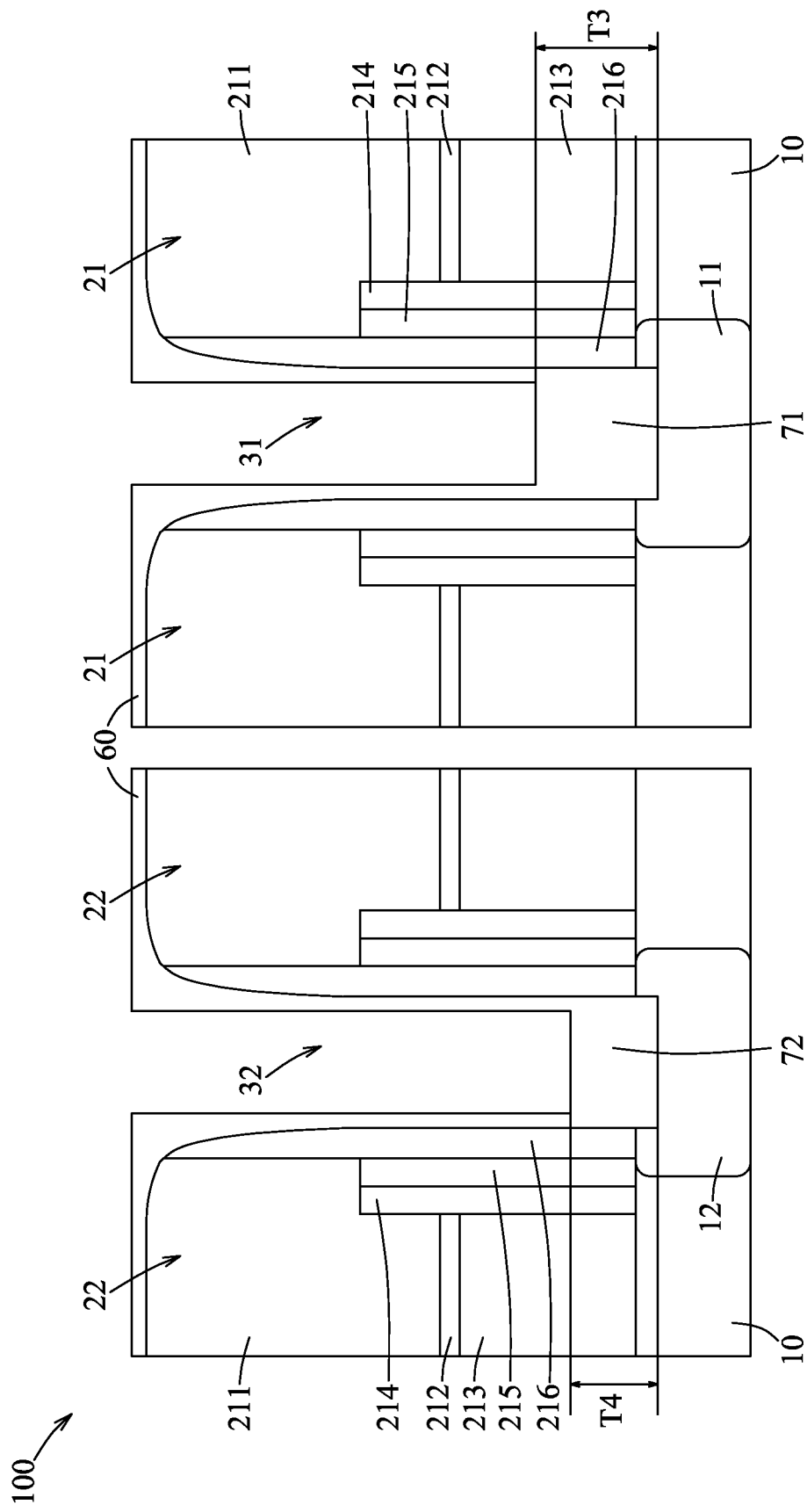

Referring to FIG. 1 and the example illustrated in FIG. 8, the method proceeds to step 107, where a second metal layer 60 is formed, after removal of the remaining portion of the second oxidation layer 121' shown in FIG. 6. The first silicide portion 50 is further reacted with a first portion of the second metal layer 60 which is deposited on the first silicide portion 50 to obtain a reacted first silicide portion 71. In addition, a second portion of the second metal layer 60 deposited on the second semiconductor portion 12 in the second recess 32 is permitted to react with the second semiconductor portion 12 to form a second silicide portion 72.

In step 107, the second metal layer 60 is formed using, for example but not limited to, a CVD process, such as PECVD. In some embodiments, a precursor including, for example, but not limited to, titanium tetrachloride, in addition to the presence of nitrogen, ammonia, hydrogen, or combinations thereof, is used, and the second metal layer 60 formed therefrom includes, for example, but not limited to titanium. Other suitable precursors and/or materials of the second metal layer 60 are within the contemplated scope of the present disclosure. In some embodiments, the CVD process is conducted at a temperature ranging from about 380° C. to about 480° C. for a time period ranging from about 100 seconds to about 500 seconds under a pressure ranging from about 100 mTorr to about 1 Torr. Under such relatively high temperature, for the first silicide portion 50, titanium is permitted to react with NiPtSiGe to form the reacted first silicide portion 71 including titanium nickel platinum silicon germanium (TiNiPtSiGe); and for the second semiconductor portion 12, titanium is permitted to react with silicon to form the second silicide portion 72 including titanium silicde (TiSi). In some embodiments, the reacted first silicide portion 71 has a thickness (T3) ranging from about 6 nm to about 11 nm. In some embodiments, the second silicide portion 72 has a thickness (T4) ranging from about 5 nm to about 9 nm. In some embodiments, the thickness of the second silicide portion 72 is greater than that of the reacted first silicide portion 71 by about 1 nm to about 3 nm.

The CVD process is a selective growing process, in which the second metal layer 60 may have a higher growing rate on silicon, and a lower growing rate on the first and second gate features 21, 22 made of silicon nitride. That is, the first and second portions of the second metal layer 60 respectively grown on the first silicide portion 50 and on the second semiconductor portion 12 are found to be much thicker than a remaining portion of the second metal layer 60 grown on the first and second gate features 21, 22, such as the isolation elements 211, and the SNR layers 216.

In some other embodiments, step 107 includes the sub-steps of: (i) depositing the second metal layer 60 over the structure shown in FIG. 7 at a relative low temperature to prevent formation of titanium silicide; and (ii) performing a thermal treatment (for example, but not limited to, an annealing process) to permit formation of the reacted first silicide portion 71 and the second silicide portion 72. The thermal treatment can be performed in a way similar to that performed in 104, and the thickness of the titanium silicide, i.e., the thickness of the second silicide portion 72 and the reacted first silicide portion 71 can be controlled by varying the temperature of the thermal treatment.

Other suitable processes and/or adjustments of parameters for obtaining the reacted first silicide portion 71 and/or the second silicide portion 72 are within the contemplated scope of the present disclosure.

In some embodiments, after formation of the reacted first silicide portion 71 and the second silicide portion 72, step 107 may further include a sub-step of performing a nitrogen treatment to the reacted first silicide portion 71 and the second silicide portion 72, such that each of the reacted first silicide portion 71 and the second silicide portion 72 has an upper nitrogen-containing region (not shown) and a lower remaining region (not shown). The upper nitrogen-containing regions each serves as an oxygen barrier to prevent oxygen from diffusing into the first and second semiconductor portions 11, 12, so that the first and second semiconductor portions 11, 12 are less likely to be oxidized. In some embodiments, the upper nitrogen-containing region of the reacted first silicide portion 71 may include titanium silicon nitride (TiSiN), but is not limited thereto. In some embodiments, the upper nitrogen-containing region of the second silicide portion 72 may include titanium nickel platinum silicon germanium nitride (TiNiPtSiGeN), but is not limited thereto. Other suitable processes for forming the upper nitrogen-containing regions are within the contemplated scope of the present disclosure.

Figure 9:
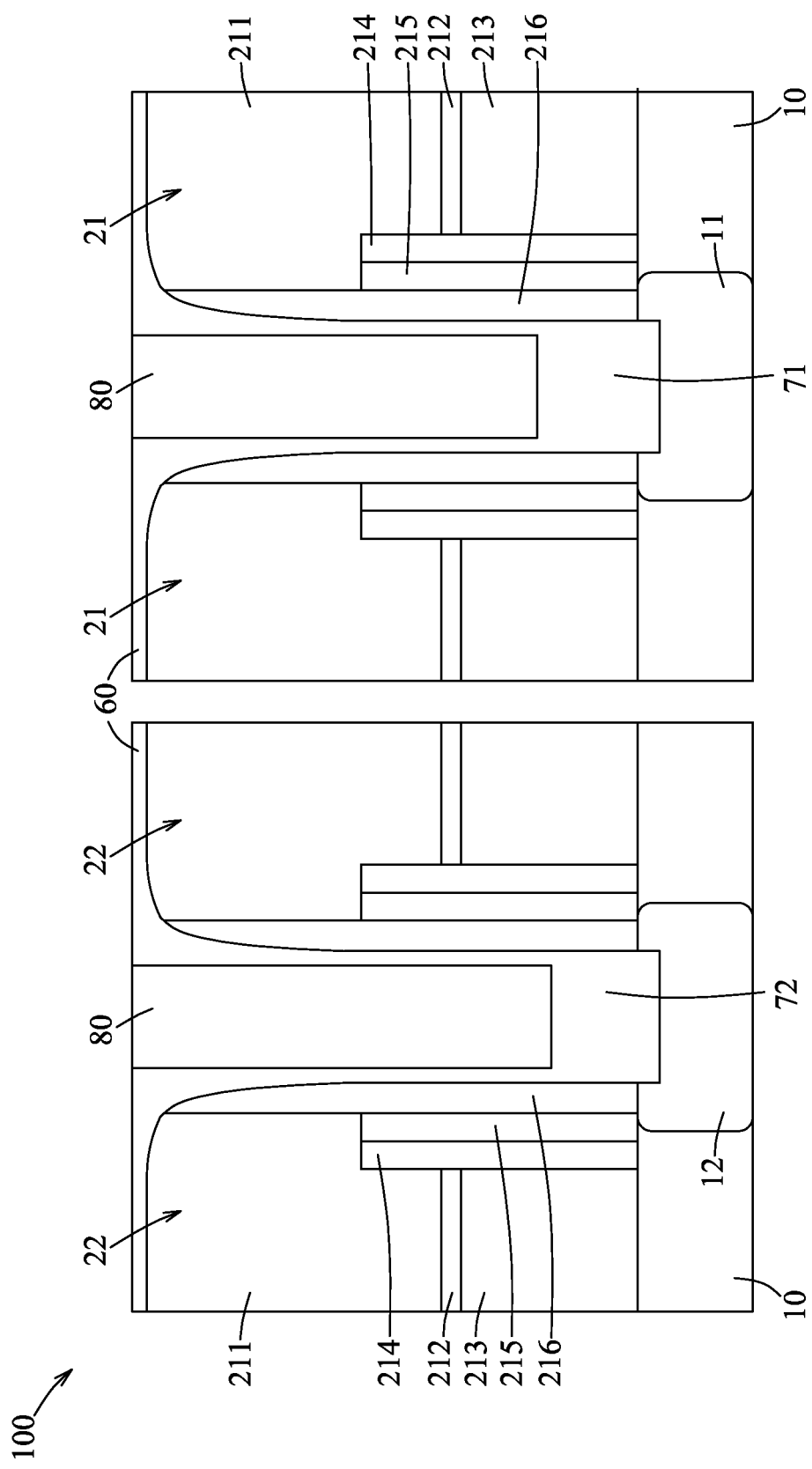

Referring to FIG. 1 and the example illustrated in FIG. 9, the method proceeds to step 108, where metal contacts 80 are respectively formed in the first and second recesses 31, 32 shown in FIG. 8, after performing the nitrogen treatment of step 107. In some embodiments, step 108 includes sub-steps of: (i) depositing a metal contact material layer (which is to form the metal contacts 80) over the upper nitrogen-containing region of each of the reacted first silicide portion 71 and the second silicide portion 72 to fill the first and second recesses 31, 32; (ii) removing an excess of the metal contact material layer using, for example, but not limited to, CMP, to expose the second metal layer 60 formed on an upper surface of the first and second gate features 21, 22 (in other cases not shown, the CMP may be performed to expose the upper surface of the first and second gate features 21, 22). Thereafter, the metal contacts 80 are formed. In some embodiments, the metal contacts 80 include cobalt (Co), ruthenium (Ru), tungsten (W), molybdenum (Mo), or combinations thereof. Other suitable processes and materials for forming the metal contacts 80 are within the contemplated scope of the present disclosure.

By completing step 108, the semiconductor structure according to the disclosure is obtained. In some embodiments, some steps in the method may be modified, replaced, or eliminated without departure from the spirit and scope of the present disclosure. In some alternative embodiments, the semiconductor structure may further include additional features, and/or some features present in the semiconductor structure may be modified, replaced, or eliminated without departure from the spirit and scope of the present disclosure.

Figure 10:
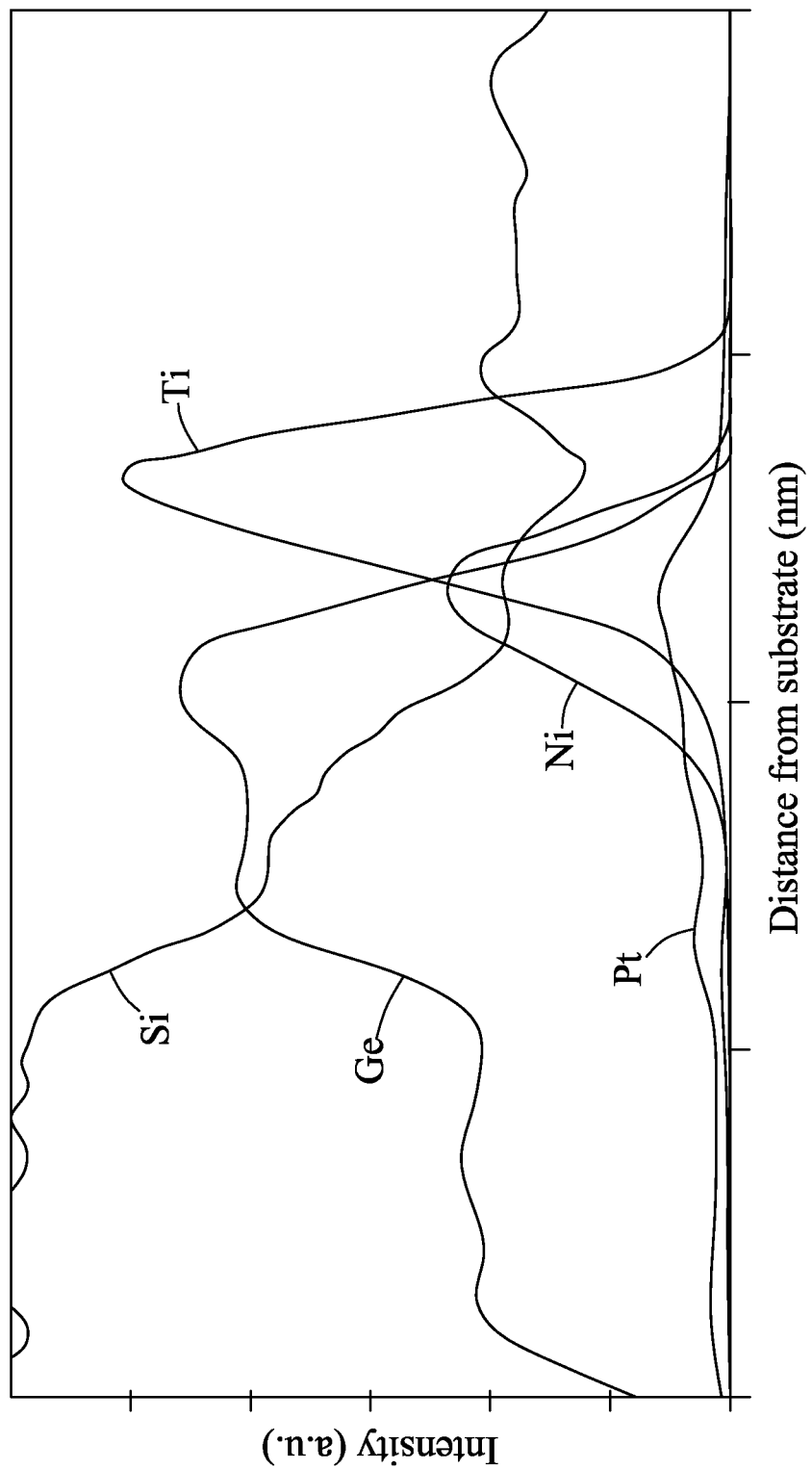
FIG. 10 is a compositional depth profile for a first semiconductor portion and a reacted first silicide portion of a sample taken along a direction away from a substrate in accordance with some embodiments.
Figure 11:
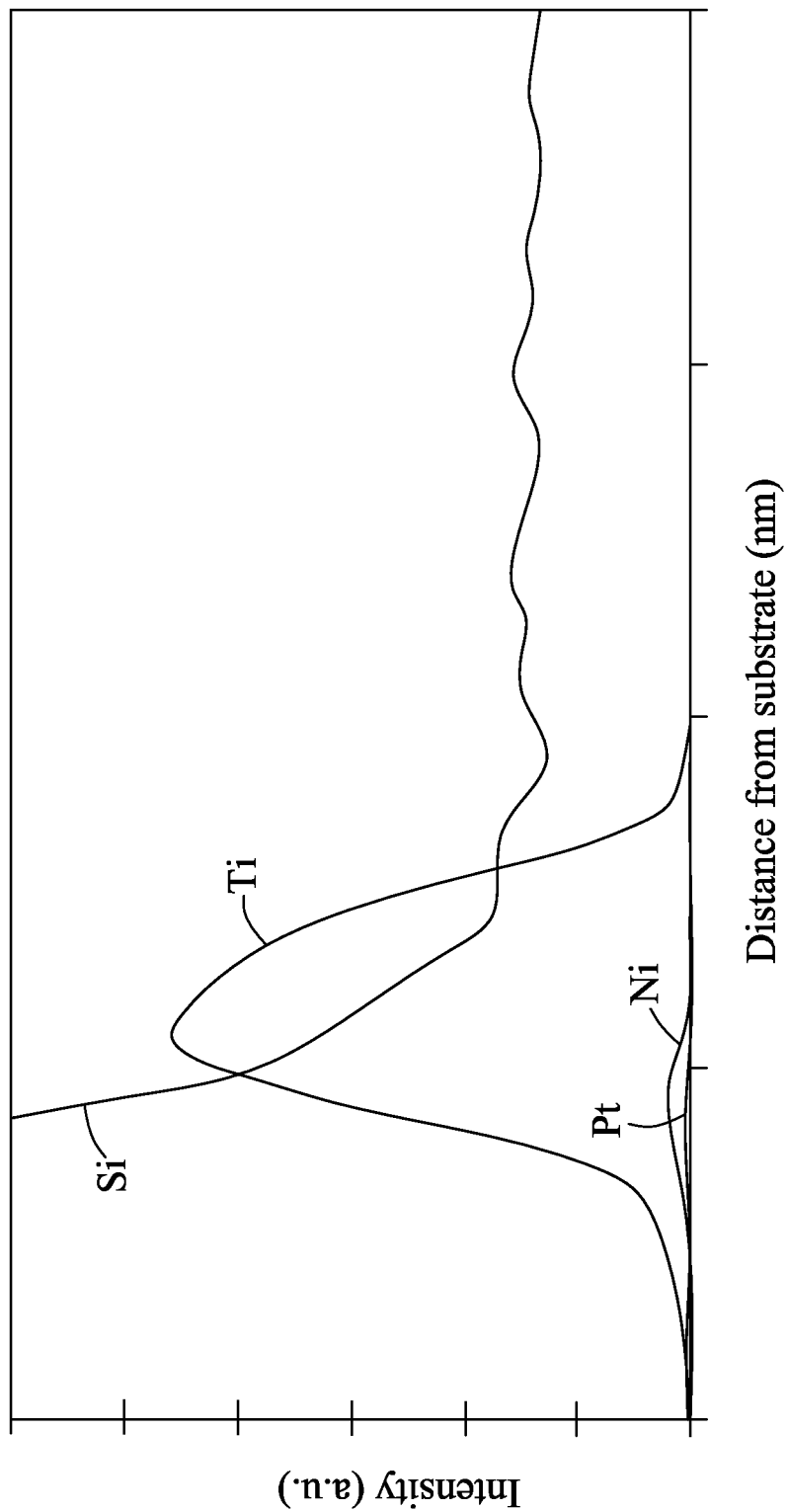
FIG. 11 is a compositional depth profile for a second semiconductor portion and a second silicide portion of the sample taken along a direction away from the substrate in accordance with some embodiments.

A sample of semiconductor structure prepared in accordance with the method of the present disclosure is subjected to a compositional analysis. FIG. 10 is a compositional depth profile for the first semiconductor portion 11 and the reacted first silicide portion 71 of the sample taken along a direction away from the substrate. It can be seen from the profile that the first semiconductor portion 11 (the leftmost portion of the profile) includes mainly silicon (denoted by "Si") and germanium (denoted by "Ge"), and the reacted first silicide portion 71 (the middle portion of the profile) includes mainly nickel (denoted by "Ni"), platinum (denoted by "Pt"), and titanium (denoted by "Ti") in addition to Si and Ge. FIG. 11 is a compositional depth profile for the second semiconductor portion 12 and the second silicide portion 72 of the sample taken along a direction away from the substrate. It can be seen from the profile that the second semiconductor portion 12 (the leftmost portion of the profile) includes mainly Si, and the second silicide portion 72 (the middle portion of the profile) includes, mainly Ti in addition to Si and Ge. The compositional depth profiles shown in FIGS. 10 and 11 indicate that a semiconductor structure formed with a dual silicide, in which the first semiconductor portion 11 (the p-type semiconductor portion) is formed with a TiNiPtSiGe, and the second semiconductor portion 12 (the n-type semiconductor portion) is formed with a TiSi, can be obtained using the method according to the present disclosure.

The embodiments of the present disclosure have the following advantageous features. In the method of the present disclosure, dual silicide formation can be achieved by one patterning process (during preparation of the patterned structure in step 101). In comparison with conventional methods in which more patterning processes are involved, the method of the present disclosure significantly reduces variations of critical dimension of the recesses (in which metal contacts are formed). Furthermore, the method of the present disclosure is applicable to various types of metals, and thus to various types of metal silicide formations by forming the first and second oxidation layers with different thicknesses and having different etching rates when subjected to an etching process, ensuring that, after the pre-clean process, a remaining portion of the second oxidation layer is thick enough to serve as the barrier layer that prevents any metals (the first metal layer) formed thereon from diffusing therethrough.

In accordance with some embodiments of the present disclosure, a method for manufacturing a semiconductor structure includes: forming a patterned structure which includes a first semiconductor portion and a second semiconductor portion, the first and second semiconductor portions having different materials; and performing an oxide formation process to oxidize the first and second semiconductor portions such that a first oxidation layer formed on the first semiconductor portion has a thickness less than that of a second oxidation layer formed on the second semiconductor portion.

In accordance with some embodiments of the present disclosure, during the oxide formation process, an oxidizing agent is introduced to oxidize the first and second semiconductor portions, and a thickness controlling agent is introduced such that the thickness of the first oxidation layer is less than that of the second oxidation layer.

In accordance with some embodiments of the present disclosure, the oxidizing agent includes oxygen, water, or a combination thereof; and the thickness controlling agent is a reducing agent which reduces at least a part of the first oxidation layer, and which includes hydrogen, ammonia, hydrofluoric acid, or combinations thereof.

In accordance with some embodiments of the present disclosure, the oxidizing agent includes oxygen, water, or a combination thereof; and the thickness controlling agent is an etchant which has a higher etching rate for the first oxidation layer than the second oxidation layer, and which includes hydrogen chloride.

In accordance with some embodiments of the present disclosure, the first semiconductor portion includes a silicon germanium-based material, and the second semiconductor portion includes a silicon-based material.

In accordance with some embodiments of the present disclosure, the first oxidation layer includes silicon oxide and germanium oxide, and the second oxidation layer includes silicon oxide.

In accordance with some embodiments of the present disclosure, the first semiconductor portion is a p-type semiconductor portion, and the second semiconductor portion is an n-type semiconductor portion.

In accordance with some embodiments of the present disclosure, the first oxidation layer has a thickness ranging from 1 nm to 4 nm, and the second oxidation layer has a thickness ranging from 4 nm to 8 nm.

In accordance with some embodiments of the present disclosure, a method for manufacturing a semiconductor structure includes: forming a patterned structure which includes a p-type semiconductor portion and an n-type semiconductor portion; and performing an oxide formation process to oxidize the p-type semiconductor portion and the n-type semiconductor portion such that a first oxidation layer formed on the p-type semiconductor portion has a thickness less than that of a second oxidation layer formed on the n-type semiconductor portion.

In accordance with some embodiments of the present disclosure, the p-type semiconductor portion includes a silicon germanium-based material; the n-type semiconductor portion includes a silicon-based material; and an amount of germanium present in the silicon germanium-based material is higher than an amount of germanium present in the silicon-based material.

In accordance with some embodiments of the present disclosure, the amount of germanium present in the silicon germanium-based material ranges from 35 wt % to 65 wt % based on a total weight of the silicon germanium-based material.

In accordance with some embodiments of the present disclosure, the first oxidation layer includes silicon oxide and germanium oxide, and the second oxidation layer includes silicon oxide.

In accordance with some embodiments of the present disclosure, during the oxide formation process, at least a portion of germanium oxide formed during oxidation of the p-type semiconductor portion is reduced by a reducing agent so as to permit the thickness of the first oxidation layer to be less than that of the second oxidation layer.

In accordance with some embodiments of the present disclosure, the reducing agent is applied using a plasma treatment or an annealing treatment.

In accordance with some embodiments of the present disclosure, during the oxide formation process, at least a portion of germanium oxide formed during oxidation of the p-type semiconductor portion is removed by an etchant which has a higher etching rate for the first oxidation layer than the second oxidation layer so as to permit the thickness of the first oxidation layer to be less than that of the second oxidation layer.

In accordance with some embodiments of the present disclosure, a method for manufacturing a semiconductor structure includes: forming a patterned structure which includes a semiconductor fin, a first semiconductor portion formed in the semiconductor fin, a second semiconductor portion formed in the semiconductor fin and spaced apart from the first semiconductor portion, two first gate features formed on the semiconductor fin at two opposite sides of the first semiconductor portion to define a first recess, and two second gate features formed on the semiconductor fin at two opposite sides of the second semiconductor portion to define a second recess; and performing an oxide formation process to oxidize the first and second semiconductor portions such that a first oxidation layer formed on the first semiconductor portion has a thickness less than that of a second oxidation layer formed on the second semiconductor portion.

In accordance with some embodiments of the present disclosure, the first semiconductor portion is a p-type semiconductor portion, and the second semiconductor portion is an n-type semiconductor portion; and the first oxidation layer includes silicon oxide and germanium oxide, and the second oxidation layer includes silicon oxide.

In accordance with some embodiments of the present disclosure, during the oxide formation process, at least a portion of germanium oxide formed during oxidation of the first semiconductor portion is reduced by a reducing agent so as to permit the thickness of the first oxidation layer to be less than that of the second oxidation layer.

In accordance with some embodiments of the present disclosure, during the oxide formation process, at least a portion of germanium oxide formed during oxidation of the first semiconductor portion is removed by an etchant which has a higher etching rate for the first oxidation layer than the second oxidation layer so as to permit the thickness of the first oxidation layer to be less than that of the second oxidation layer.

In accordance with some embodiments of the present disclosure, the method further includes: performing a pre-clean process such that the first oxidation layer is removed and at least a portion of the second oxidation layer remains on the second semiconductor portion; and forming a first metal layer, after performing the pre-clean process, such that a portion of the first metal layer deposited on the first semiconductor portion in the first recess is permitted to react with the first semiconductor portion to form a first silicide portion; removing an unreacted portion of the first metal layer to expose the remaining portion of the second oxidation layer; removing the remaining portion of the second oxidation layer, after removal of the unreacted portion of the first metal layer, to expose the second semiconductor portion; and forming a second metal layer, after removal of the remaining portion of the second oxidation layer, such that the first silicide portion is permitted to react with a first portion of the second metal layer which is deposited on the first silicide portion to obtain a reacted first silicide portion, and such that a second portion of the second metal layer deposited on the second semiconductor portion in the second recess is permitted to react with the second semiconductor portion to form a second silicide portion.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a patterned structure which includes a first semiconductor portion and a second semiconductor portion, the first semiconductor portion and the second semiconductor portion having different materials;
   performing an oxide formation process to oxidize the first semiconductor portion and the second semiconductor portion such that a first oxidation layer formed on the first semiconductor portion has a thickness less than a thickness of a second oxidation layer formed on the second semiconductor portion;
   after the oxide formation process, performing a removal process so that the first oxidation layer is removed to expose the first semiconductor portion, and the second oxidation layer remains covering the second semiconductor portion;
   after the removal process, forming a first silicide portion on the first semiconductor portion;
   after forming the first silicide portion, removing the second oxidation layer to expose the second semiconductor portion; and after removing the second oxidation layer, forming a second silicide portion on the second semiconductor portion.

2. The method according to claim 1, wherein, during the oxide formation process, an oxidizing agent is introduced to oxidize the first semiconductor portion and the second semiconductor portion, and a thickness controlling agent is introduced such that the thickness of the first oxidation layer is less than the thickness of the second oxidation layer.

3. The method according to claim 2, wherein:
the oxidizing agent includes oxygen, water, or a combination thereof; and
the thickness controlling agent is a reducing agent which reduces at least a part of the first oxidation layer, and which includes hydrogen, ammonia, hydrofluoric acid, or combinations thereof.

4. The method according to claim 2, wherein:
the oxidizing agent includes oxygen, water, or a combination thereof; and
the thickness controlling agent is an etchant which has a higher etching rate for the first oxidation layer than the second oxidation layer, and which includes hydrogen chloride.

5. The method according to claim 1, wherein the first semiconductor portion includes a silicon germanium-based material, and the second semiconductor portion includes a silicon-based material.

6. The method according to claim 5, wherein the first oxidation layer includes silicon oxide and germanium oxide, and the second oxidation layer includes silicon oxide.

7. The method according to claim 1, wherein the first semiconductor portion is a p-type semiconductor portion, and the second semiconductor portion is an n-type semiconductor portion.

8. The method according to claim 1, wherein the first oxidation layer has a thickness ranging from 1 nm to 4 nm, and the second oxidation layer has a thickness ranging from 4 nm to 8 nm.

9. A method for manufacturing a semiconductor structure, comprising:
forming a patterned structure which includes a p-type semiconductor portion and an n-type semiconductor portion;
performing an oxide formation process to oxidize the p-type semiconductor portion and the n-type semiconductor portion such that a first oxidation layer formed on the p-type semiconductor portion has a thickness less than a thickness of a second oxidation layer formed on the n-type semiconductor portion;
after the oxide formation process, performing a removal process so that the first oxidation layer is removed to expose the p-type semiconductor portion, and the second oxidation layer remains covering the n-type semiconductor portion;
after the removal process, forming a first silicide portion on the p-type semiconductor portion;
after forming the first silicide portion, removing the second oxidation layer to expose the n-type semiconductor portion; and
after removing the second oxidation layer, forming a second silicide portion on the n-type semiconductor portion.

10. The method according to claim 9, wherein:
the p-type semiconductor portion includes a silicon germanium-based material;
the n-type semiconductor portion includes a silicon-based material; and
an amount of germanium present in the silicon germanium-based material is higher than an amount of germanium present in the silicon-based material.

11. The method according to claim 10, wherein the amount of germanium present in the silicon germanium-based material ranges from 35 wt % to 65 wt % based on a total weight of the silicon germanium-based material.

12. The method according to claim 10, wherein the first oxidation layer includes silicon oxide and germanium oxide, and the second oxidation layer includes silicon oxide.

13. The method according to claim 10, wherein, during the oxide formation process, at least a portion of germanium oxide formed during oxidation of the p-type semiconductor portion is reduced by a reducing agent so as to permit the thickness of the first oxidation layer to be less than the thickness of the second oxidation layer.

14. The method according to claim 13, wherein the reducing agent is applied using a plasma treatment or an annealing treatment.

15. The method according to claim 10, wherein, during the oxide formation process, at least a portion of germanium oxide formed during oxidation of the p-type semiconductor portion is removed by an etchant which has a higher etching rate for the first oxidation layer than the second oxidation layer so as to permit the thickness of the first oxidation layer to be less than the thickness of the second oxidation layer.

16. A method for manufacturing a semiconductor structure, comprising:
forming a patterned structure which includes
a semiconductor fin,
a first semiconductor portion formed in the semiconductor fin,
a second semiconductor portion formed in the semiconductor fin and spaced apart from the first semiconductor portion,
two first gate features formed on the semiconductor fin at two opposite sides of the first semiconductor portion to define a first recess, and
two second gate features formed on the semiconductor fin at two opposite sides of the second semiconductor portion to define a second recess;
performing an oxide formation process to oxidize the first semiconductor portion and the second semiconductor portion such that a first oxidation layer formed on the first semiconductor portion has a thickness less than a thickness of a second oxidation layer formed on the second semiconductor portion;
performing a pre-clean process such that the first oxidation layer is removed and at least a portion of the second oxidation layer remains on the second semiconductor portion;
forming a first metal layer, after performing the pre-clean process, such that a portion of the first metal layer deposited on the first semiconductor portion in the first recess is permitted to react with the first semiconductor portion to form a first silicide portion;
removing an unreacted portion of the first metal layer to expose the remaining portion of the second oxidation layer;
removing the remaining portion of the second oxidation layer, after removal of the unreacted portion of the first metal layer, to expose the second semiconductor portion; and
forming a second metal layer, after removal of the remaining portion of the second oxidation layer, such that the first silicide portion is permitted to react with a first portion of the second metal layer which is deposited on the first silicide portion to obtain a reacted first silicide portion, and such that a second portion of the second metal layer deposited on the second semiconductor portion in the second recess is permitted to react with the second semiconductor portion to form a second silicide portion.

17. The method according to claim 16, wherein:
the first semiconductor portion is a p-type semiconductor portion, and the second semiconductor portion is an n-type semiconductor portion; and
the first oxidation layer includes silicon oxide and germanium oxide, and the second oxidation layer includes silicon oxide.

18. The method according to claim 17, wherein, during the oxide formation process, at least a portion of germanium oxide formed during oxidation of the first semiconductor portion is reduced by a reducing agent so as to permit the thickness of the first oxidation layer to be less than the thickness of the second oxidation layer.

19. The method according to claim 17, wherein, during the oxide formation process, at least a portion of germanium oxide formed during oxidation of the first semiconductor portion is removed by an etchant which has a higher etching rate for the first oxidation layer than the second oxidation layer so as to permit the thickness of the first oxidation layer to be less than the thickness of the second oxidation layer.

20. The method according to claim 16, wherein the first silicide portion is prevented from forming on the second semiconductor portion.

* * * * *